United States Patent
Lim et al.

(10) Patent No.: US 7,622,952 B1
(45) Date of Patent: Nov. 24, 2009

(54) PERIPHERY CLOCK SIGNAL DISTRIBUTION CIRCUITRY FOR STRUCTURED ASIC DEVICES

(75) Inventors: Chooi Pei Lim, Penang (MY); Siang Poh Loh, Penang (MY); Hong Ming Siew, Penang (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/156,090

(22) Filed: May 28, 2008

(51) Int. Cl.
*H03K 19/177* (2006.01)
*H01L 25/00* (2006.01)
(52) U.S. Cl. .............................. 326/41; 326/39; 326/47
(58) Field of Classification Search ........................ None
See application file for complete search history.

(56) References Cited

U.S. PATENT DOCUMENTS

| | | | |
|---|---|---|---|
| 6,886,143 B1 * | 4/2005 | Park ............................... 716/2 |
| 7,243,329 B2 | 7/2007 | Chua et al. |
| 7,275,232 B2 | 9/2007 | Schleicher et al. |
| 2005/0041149 A1 * | 2/2005 | Chan et al. .................. 348/553 |
| 2006/0267661 A1 | 11/2006 | Lim et al. |

* cited by examiner

*Primary Examiner*—Anh Q Tran
(74) *Attorney, Agent, or Firm*—Ropes & Gray LLP; Robert R. Jackson

(57) ABSTRACT

A structured ASIC device includes highly flexible clock signal routing to peripheral IO circuitry of the device. A plurality of peripheral IO circuits are divided into subpluralities of adjacent ones of those circuits. Each subplurality has associated clock signal routing that is mask-programmable to supply any of a plurality of clock signals to any of the IO circuits in the subplurality. Core circuitry of the structured ASIC includes clock signal distribution circuitry, and that distribution circuitry can supply (via buffers associated with each subplurality) the same plurality of clock signals to the routing circuitry associated with all of the subpluralities.

20 Claims, 9 Drawing Sheets

PERIPHERY CLOCK SIGNAL DISTRIBUTION CIRCUITRY FOR STRUCTURED ASIC DEVICES

BACKGROUND OF THE INVENTION

This invention relates to clock signal distribution circuitry for integrated circuit devices. Typically, the invention is embodied in clock signal distribution circuitry of structured application-specific integrated circuits ("structured ASICs").

Structured ASICs are devices that have some predetermined circuit characteristics, but that are also customizable to some degree. For example, a structured ASIC may include a two-dimensional array of many relatively small logic elements (referred to herein as hard logic elements, hybrid logic elements, or HLES). The basic circuitry of these HLEs is always the same or substantially the same, and is provided by a subset of the masks that are used to make (fabricate) the structured ASIC. Accordingly, the masks in this subset can be always the same or substantially the same. The overall function(s) performed by an HLE can be customized to some extent by customizing one or more additional masks used to make a particular structured ASIC product. Similarly, connections to, from, and/or between HLEs can be customized by customizing additional masks used to make the product. Because the structured ASIC always has the same basic circuitry, the task of designing it to perform particular tasks is greatly simplified, speeded up, increased in reliability, and reduced in cost. An entire ASIC does not have to be designed "from scratch." Instead, only the customizable masks have to be designed.

A possible use of structured ASIC technology is to produce ASICs that are functionally equivalent to programmed field-programmable gate arrays ("FPGAs"). After a logic design has been adequately "proven" in an FPGA, the design may be "migrated" to a structured ASIC implementation. References such as Chua et al. U.S. Pat. No. 7,243,329 and Schleicher et al. U.S. Pat. No. 7,275,232 show this type of use of structured ASIC technology.

FPGAs typically include a "core" of many instances of programmable logic blocks (and possibly also other blocks such as memory, digital signal processing or DSP circuitry, etc.) in a highly regular pattern (e.g., a two-dimensional array of intersecting rows and columns of circuit blocks). FPGAs also typically include many instances of input/output or IO circuitry, which may be arranged in a ring around the outside or periphery of the device (and therefore around the above-mentioned core circuitry). Both the core circuitry and the above-mentioned IO or peripheral circuitry are very often intensive and extensive users of clock signals. For example, the core circuitry may include many data signal registers that need to be clocked at precise times to reliably store and subsequently output data signals applied to them. The peripheral IO circuitry also typically includes many instances of data signal registers that need to be precisely clocked for similar purposes.

An FPGA may need to distribute many different clock signals in parallel to many different parts of the circuitry. For example, these different clock signals may have different phase shifts relative to one another, and/or they may have different frequencies relative to one another (e.g., as a result of dividing the frequency of one signal by several different frequency division factors to produce several derivative clock signals). Some of these clock signals may need to be made available throughout all or at least a large portion of the FPGA. Other clock signals may only be needed in certain relatively confined areas on the FPGA.

To meet all of these various possible clock signal needs, an FPGA is typically given clock signal distribution circuitry that is both extensive and highly flexible in terms of its usability (i.e., by being programmable or configurable to route any of many different clock signals in many different ways from various possible sources to various possible destinations). Nevertheless, there are typically some significant limitations on how clock signals can be routed in an FPGA. For example, IO registers associated with a particular row or column of core logic blocks in an FPGA may only be able to receive significantly fewer than all the clock signals on the FPGA, and also significantly fewer clock signals than the number of IO registers that are associated with that row or column. As a specific example, an FPGA may have a total of 26 different clock signals theoretically available to the IO registers associated with a core column, and it may have 24 IO registers associated with that column. But the clock signal routing may be such that only 9 different clock signals can actually reach those 24 registers.

As mentioned above, FPGAs typically have a highly regular core structure (e.g., a two-dimensional array of intersecting rows and columns of logic blocks). The above-mentioned clock circuitry on an FPGA can have a well-defined arrangement relative to this well-defined pattern of logic blocks. On the other hand, structured ASICs of the type shown in the above-mentioned Chua et al. and Schleicher et al. references have a different core architecture in which there is no predetermined correspondence, for example, between the functions performed in a particular FPGA core column or row and equivalent functions performed in any particular portion of the structured ASIC core circuitry. This can make it more difficult, in a structured ASIC implementation that is intended to be functionally equivalent to a programmed FPGA, to get the clock signals that are needed by particular peripheral IO registers to those registers. Moreover, some users may want pin-for-pin compatibility between the IO pins of the functionally equivalent FPGA and structured ASIC, while other users may want the pin-outs of these two, otherwise functionally equivalent devices to be different (so-called non-socket migration). Considerations such as these militate against "structuring" the peripheral clock distribution circuitry of a structured ASIC. On the other hand, leaving such circuitry completely or highly unstructured is contrary to the benefits that are typically sought through the use of structured ASICs (e.g., quick, reliable, and low-cost conversion of a programmed FPGA design into a structured ASIC implementation).

SUMMARY OF THE INVENTION

In accordance with certain possible aspects of the invention, an integrated circuit device (such as a structured ASIC) may include core circuitry having an outer periphery. The device may further include a plurality of input/output ("IO") circuits disposed outside of said outer periphery, the 10 circuits being grouped in a multiplicity of groups, each of which groups includes a respective subplurality of adjacent ones of the IO circuits. The device may still further include routing circuitry disposed between the outer periphery and each of the groups. The routing circuitry thus associated with each of the groups may include (1) a plurality of first conductors, each of which extends past all of the IO circuits in the associated group, and each of which receives a respective one of a plurality of clock signals from the core circuitry, (2) a plurality of second conductors, each of which extends across all of the first conductors to a respective one of the IO circuits in the associated group, and (3) a mask-programmable via option at each intersection between a first conductor and a second conductor.

The first conductors associated with each of the groups are preferably discontinuous with the first conductors associated with each of the other groups.

The plurality of first conductors associated with each of the groups is preferably greater in number than the plurality of second conductors associated with that group.

The core circuitry preferably includes driver circuitry for driving each of the clock signals onto each of the first conductors that receives that clock signal. This driver circuitry preferably includes separate driver circuitry for the first conductors associated with each of the groups. The driver circuitry associated with each of the groups preferably includes a separate driver circuit for each of the first conductors associated with that group.

The device may be arranged so that the first conductors associated with each group receive all of the same clock signals that are received by the first conductors associated with each other group.

Further features of the invention, its nature and various advantages, will be more apparent from the accompanying drawings and the following detailed description.

DETAILED DESCRIPTION

Additional background for the present invention can be found in Lim et al. U.S. patent application Ser. No. 11/141,867, filed May 31, 2005. FIGS. 1-5 herein are repeated from the Lim et al. reference. The description of these FIGS. can be somewhat abbreviated because they have already been fully described in the Lim et al. reference (and in some cases in the Chua et al. and Schleicher et al. references).

Figure 1:
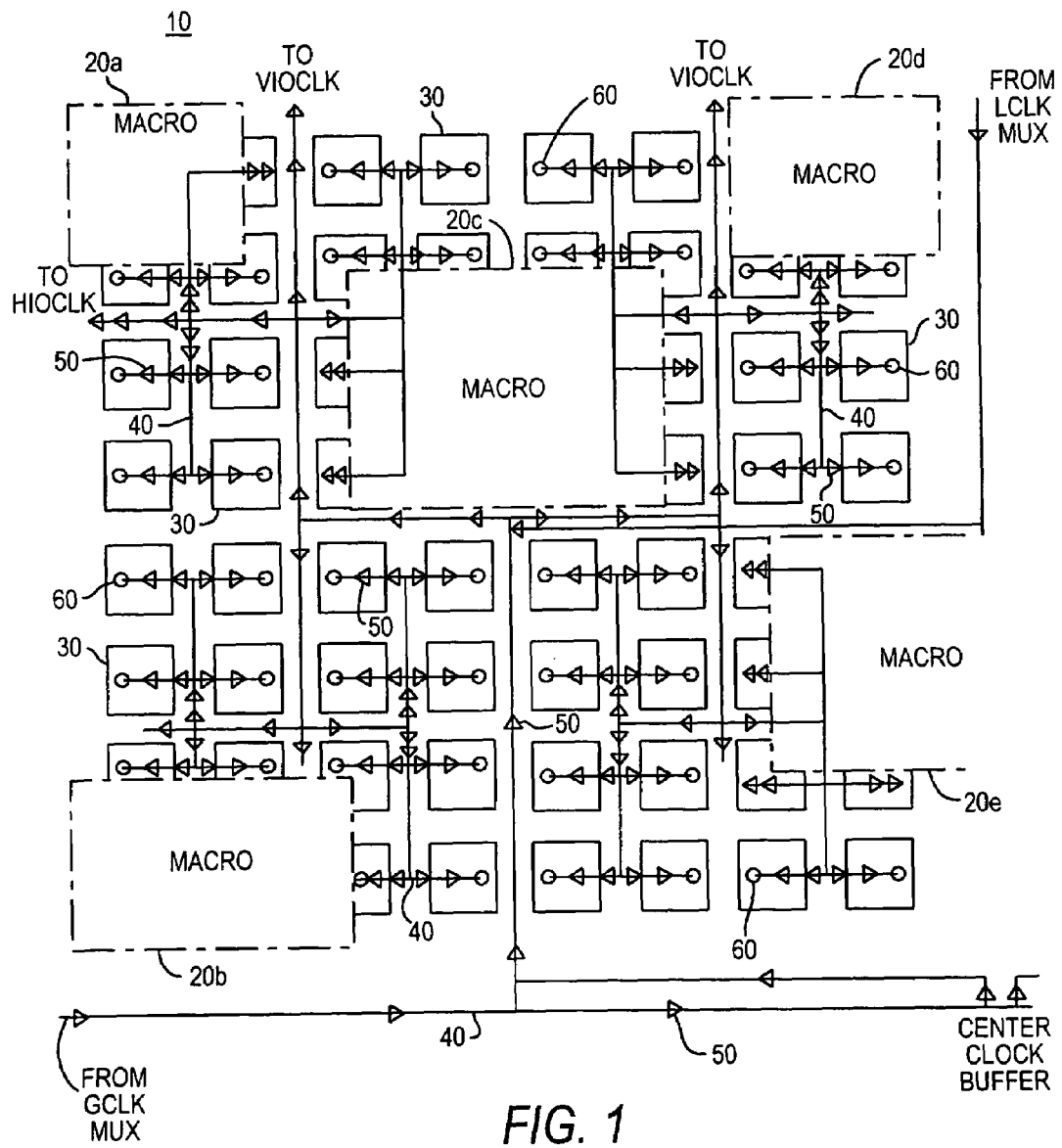
FIG. 1 is a simplified schematic block diagram of a representative portion of illustrative structured ASIC circuitry.

FIG. 1 shows a representative portion (i.e., the upper left quadrant) of the core of an illustrative structured ASIC architecture 10. The elements shown in FIG. 1 are as follows: "macro" circuit blocks 20 (e.g., blocks of random access memory, DSP circuitry, etc.), blocks 30 of HLEs, clock signal distribution conductors 40, clock signal buffers 50 (i.e., circuitry for strengthening and forwarding clock signals), and entry points 60 for clock signals going into HLE blocks.

Figure 2:
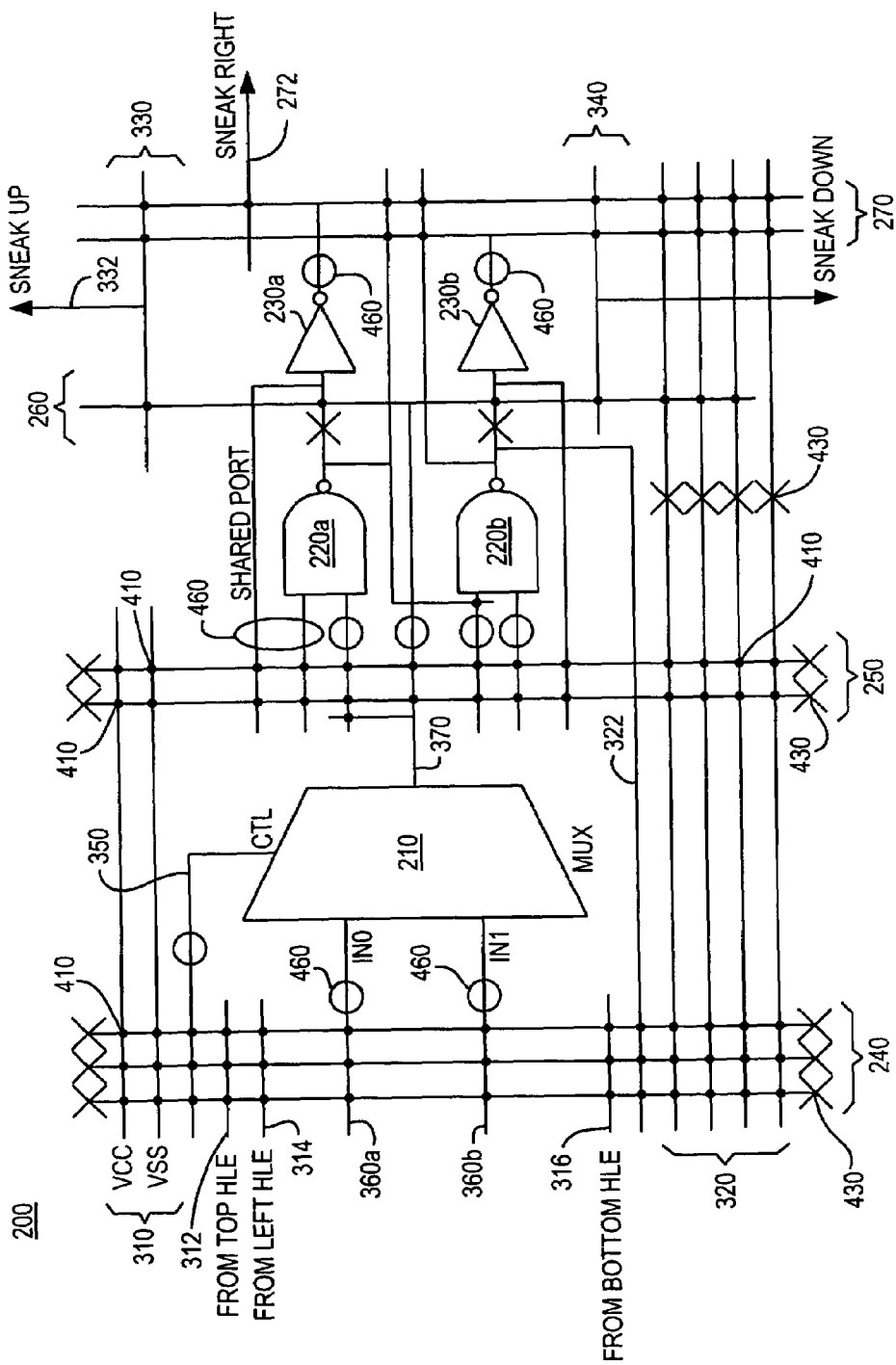
FIG. 2 is a simplified schematic block diagram of an illustrative embodiment of a representative portion of certain aspects of the circuitry shown in FIG. 1.

FIG. 2 shows an illustrative embodiment of a representative HLE 200. The elements shown in FIG. 1 are as follows: two-to-one multiplexer 210; two-input NAND gates 220a and 220b; driver circuits 230a and 230b; vertical interconnection conductors 240, 250, 260, and 270; horizontal interconnection conductors 310, 320, 322, 349, 350, 360, and 370; points 410 at which connections can be mask-programmably made between intersecting conductors; points 430 at which connections can be mask-programmably made between continuation conductor segments (in some cases in immediately adjacent HLEs); so called "sneak connections" 312, 314, 316, 332, 272, and "sneak down" that always exist to the identified immediately adjacent HLEs; and locations 460 at which connections can be mask-programmably made to mask-programmably provided conductors in higher levels of metal. Note that a connection 410 as described above is provided wherever two conductors cross at a dot. Note also that a connection 430 as described above is provided wherever an "X" is shown. Also, all open circles are the same as those numbered 460 and described above. VCC is power supply voltage. VSS is ground. HLE 200 can be mask programmed (principally through the use of interconnection points like 410, 430, and 460) to perform any of several logic functions. The function(s) performed depend on how signals are routed into, within, and out of HLE 200. For example, such routing may connect the functional elements 210, 220, and 230 in different ways.

Figure 3:
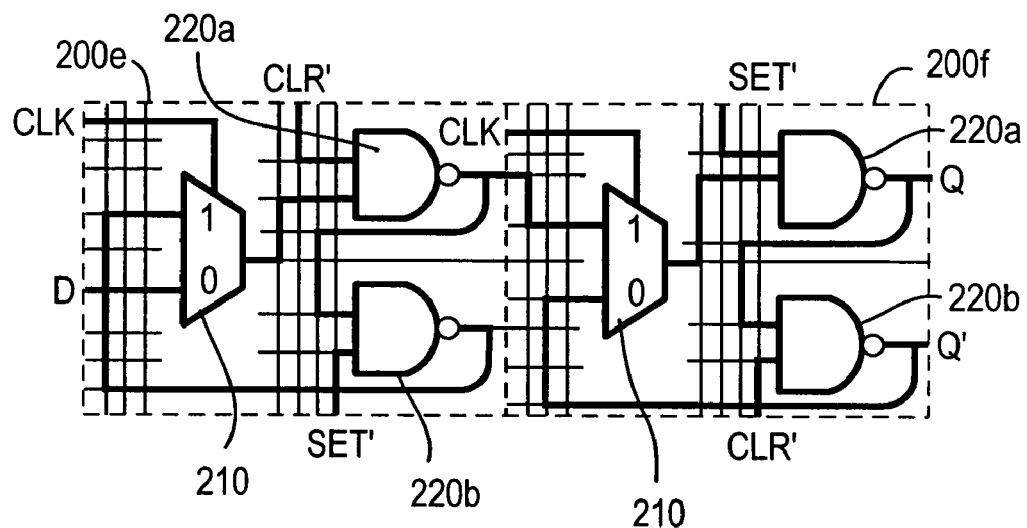
FIG. 3 is a simplified schematic block diagram of an illustrative embodiment of another representative portion of certain aspects of the circuitry shown in FIG. 1.

FIG. 3 shows an example of how two adjacent HLEs 200e and 200f can be used together (appropriately mask-programmed) to provide a flip-flop (register). Each HLE includes all the circuitry shown in FIG. 2, but for the most part only the circuitry that is actually used in the flip-flop implementation is repeated in FIG. 3. The interconnections that are actually used in the flip-flop implementation are shown using heavier lines in FIG. 3. The signals shown in FIG. 3 are data input D, clock input CLK, inverse clear CLR', inverse set SET', data output Q, and inverse data output Q'.

Figure 4:
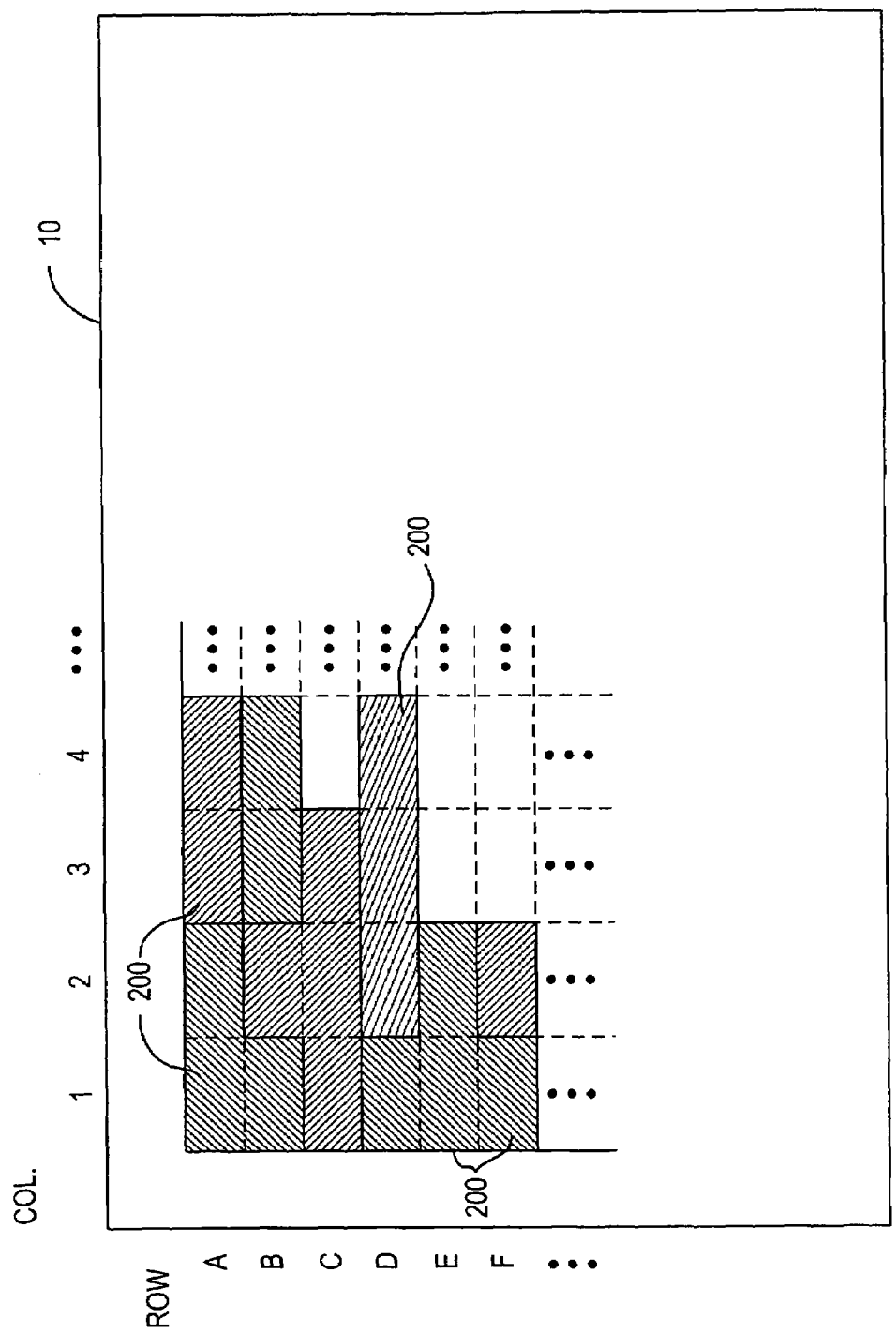
FIG. 4 is a simplified block diagram of an illustrative embodiment of a representative portion of certain aspects of the FIG. 1 circuitry.

FIG. 4 shows how several immediately adjacent HLEs 200 may be used together (as a complex HLE or CHLE) to perform logic functions that are more complex than can be performed by any one HLE. In FIG. 4, immediately adjacent HLEs that have the same shading form a CHLE. For example, using the indicated row and column identifiers, one CHLE is formed from HLEs A1, A2, and B2. Another CHLE is formed from HLEs D2, D3, and D4. A CHLE may be limited to no more than about six HLEs.

Figure 5:
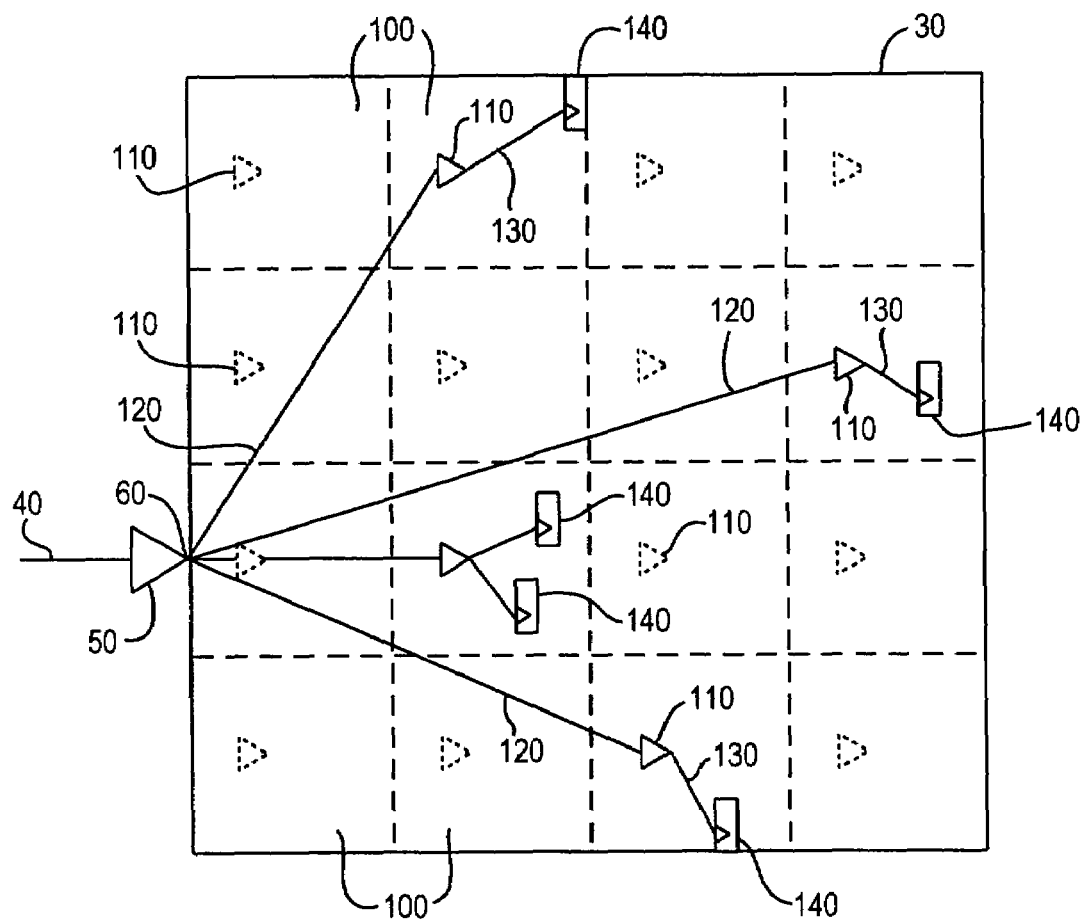
FIG. 5 is a simplified schematic block diagram of an illustrative embodiment of a representative portion of other aspects of the FIG. 1 circuitry.

FIG. 5 shows how clock signals may be routed from an input point 60 (e.g., as in FIG. 1) throughout the HLEs 200 that make up a block of HLEs 30 (again, as in FIG. 1). An HLE block 30 may contain several hundred HLEs 200. These several hundred HLEs in a block 30 may be equally divided into subgroups of HLEs 100 as shown in FIG. 5. Within each subgroup 100, one or more HLEs 200 may be used as a clock signal buffer or driver 110 for a clock signal used in that subgroup (e.g., by a flip-flop 140 in that subgroup). Clock signal distribution conductors 120 and 130 are mask-programmably provided to extend from entry point 60 to a driver 110, and from that driver to associated registers 140.

Note that drivers 50 and 110 can be provided by HLEs 200 that are mask programmed to perform that function. The above-mentioned Chua et al. reference shows several ways that the buffering strength of an HLE 200 can be selectively (mask programmably) varied.

Figure 6:
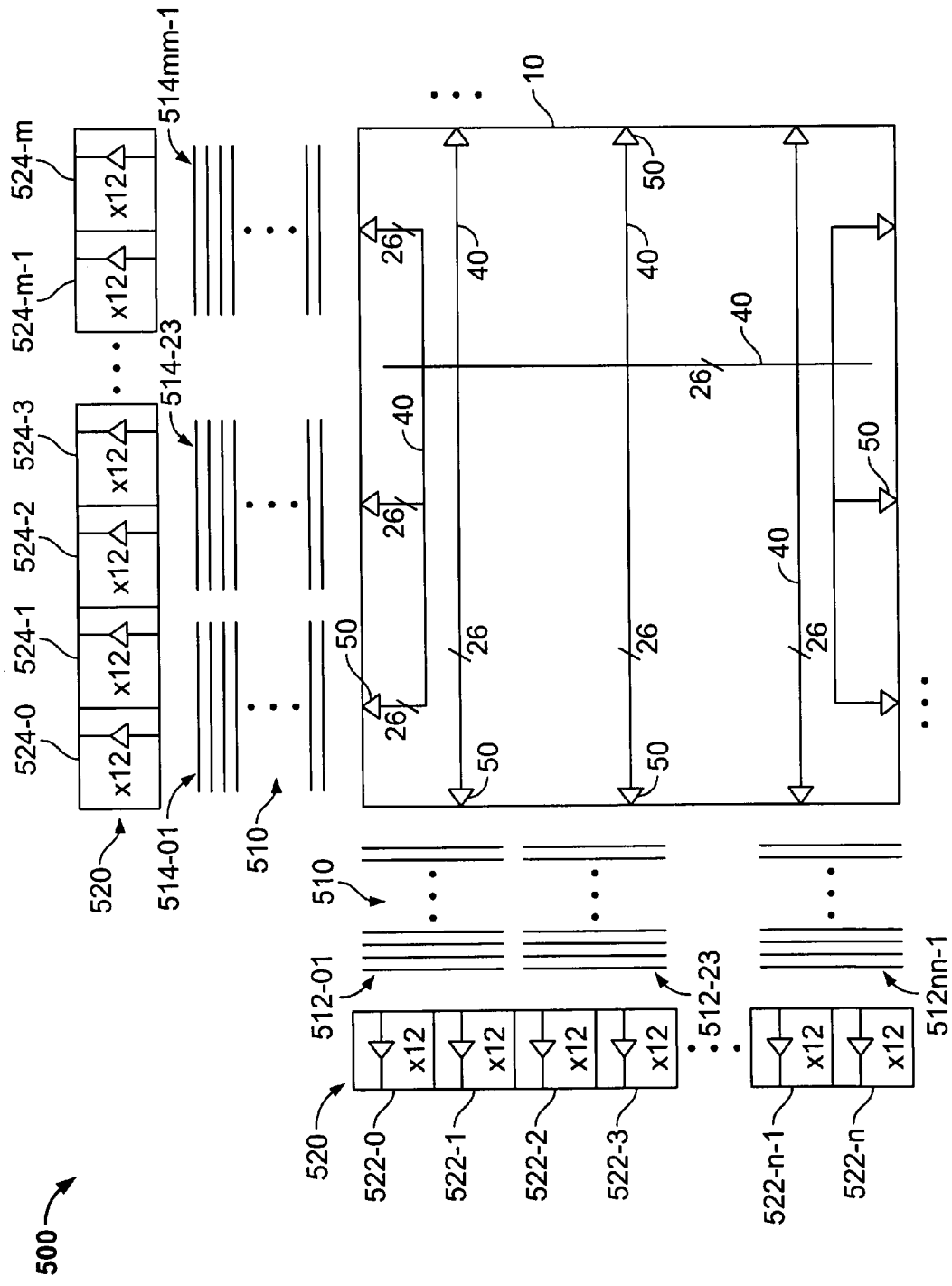
FIG. 6 is a simplified schematic block diagram of an illustrative embodiment of representative portions of circuitry in accordance with this invention.

FIG. 6 shows representative portions of an illustrative embodiment of structured ASIC circuitry (i.e., structured ASIC device 500) in accordance with the present invention. (FIG. 6 omits certain features that will be shown in subsequent FIGS.) Structured ASIC device 500 includes core circuitry 10 (which can be constructed as shown in FIGS. 1-5), a band of so-called customer layer, place and route, or P&R circuitry 510 that extends around the outer periphery of core 10, and a band of peripheral IO circuitry 520 that extends around the outer periphery of P&R circuitry 510. Although FIG. 6 only shows circuitry 510 and 520 across the top and along the left side of core 10, it will be understood that such circuitry can be provided on all sides of core 10 or on any subset of the sides of core 10. The discussion below will refer, for the most part, to only the IO circuitry that is shown along the left and across the top. But it will be understood how that discussion can be extended for similar circuitry along other sides of core 10.

As a preliminary to what follows, it is here pointed out that some layers of P&R circuitry 510 (e.g., metal layers M5 and M6) are used for mask-programmably routing data signals between core 10 and IO circuitry 520. This is highly flexible routing, which enables the user of the structured ASIC product to provide data signal connections between any (or substantially any) portion of core 10 and any (or substantially any) portion of IO circuitry 520. This aspect of circuit region 510 is conventional and is not shown in FIG. 6 or any other FIG. herein. However, other layers in P&R region 510 (e.g., metal layers M3 and M4 and VIA3) are used in connection with the present invention (i.e., to provide circuit elements 512, 514, and 530). These circuit elements are shown in certain FIGS. herein, and they are described in detail in subsequent paragraphs. These elements may sometimes be referred to as being in P&R region 510. That is true in the sense that these elements are located in the same general area as the conventional P&R circuitry. But again, these elements (which deal with clock signals, not data signals) are in layers of the circuitry that are different than and separate from the conventional P&R circuitry that is used for routing data signals between core 10 and IO circuitry 520. It will be appreciated that, in general, there is no transistor-based circuitry in region 510. Rather, there are only conductors such as P&R customer layer conductors (e.g., in M5/M6), and (in accordance with the present invention) conductors 512/514 (e.g., in M3 or M4) and vias 530 (e.g., in VIA3).

In a manner similar to an FPGA for which ASIC 500 can be used to provide functionally equivalent devices, IO circuitry 520 is organized in a plurality of IO circuit groups 522-0 through 522-n along the left-hand side of core 10, and a plurality of IO circuit groups 524-0 through 524-m along the top of core 10. Each of groups 522 and 524 includes 12 adjacent channels of IO circuitry, each of which channels may need a clock signal from core 10. Because of the possible parallels between an FPGA and structured ASIC 500, each group of IO circuitry 522 along the left-hand side of core 10 may sometimes be referred to as IO circuitry for a particular row. This is a consequence of an FPGA core typically having an architecture that includes a two-dimensional array of intersecting rows and columns of functional circuitry. The IO circuitry at or near the end of an FPGA row is therefore the IO circuitry for that row. Thus IO circuit group 522-0 may also be referred to as IO Row 0 circuitry 522 (or 522-0), because in an FPGA it would be associated with row 0 of the functional circuitry in the FPGA core. This same alternative terminology may similarly be used for other IO circuit groups (e.g., IO circuit group 522-1 may also be referred to as IO Row 1 circuitry 522 (or 522-1) due to its FPGA association with row 1 of the functional circuitry in the FPGA core). Similarly, IO circuit group 524-0 may sometimes be referred to as IO Col 0 circuitry 524 (or 524-0) because of its FPGA association with column 0 of the functional circuitry in the FPGA core. Other group 524 may have similar alternative column designations.

Although row and column terminology may sometimes be applied to IO groups 522 and 524, structured ASIC core 10 may not be used in such a way that rows of functions from an FPGA are implemented in exactly corresponding rows of circuitry in core 10. The same may also be true for columns of functions from the FPGA. Thus, core 10 may not have the same row and column organization and/or utilization as the corresponding FPGA. Nevertheless, at least some users (i.e., those who want pin-for-pin compatibility) will want the IO structure of structured ASIC 500 to look and function at least substantially identically to the corresponding FPGA IO structure. Because the FPGA IO structure has row and column groupings, those same groupings are provided in the IO circuitry 520 of ASIC 500, and the FPGA "row" and "column" terminology is also sometimes applied to those groupings in this discussion.

In a typical FPGA, only some of the clock signals available in the FPGA core are typically made available to each row and column IO circuit group, and the number of such signals made available to each group is typically less than the number of channels in that group. This can mean that an IO group does not have all of the different clock signals that it needs. The clock signals available for selection for application to an FPGA IO row or column group may also be limited, to some extent, to clock signals available in the associated row. This is logical when there is a strong association between each such IO row or column group and one of the FPGA rows or columns. But such a limitation is less logical (and also more difficult to duplicate) in a structured ASIC equivalent which does not implement each row and column of functions from the FPGA in corresponding, well-defined, predetermined rows and columns in core 10. Also, some users of ASIC 500 may not want to duplicate the pin-outs of an otherwise functionally equivalent FPGA, but may instead want to give ASIC 500 a different arrangement of pin-outs. Then the above-described FPGA-based limitations on which and how many clock signals are available for use by each IO group 522 or 524 could (if carried over to ASIC 500) prevent a user of the ASIC from being able to achieve a particular pin-out arrangement that the user wants to achieve with the ASIC. Problems of this kind are completely avoided with the peripheral clock circuitry of this invention as will now be further described.

As shown in FIG. 6, each adjacent pair of IO circuit groups 522 or 524 has an associated set of routing conductors 512 or 514 in P&R region 510. For example, IO circuit group pair 522-0 and 522-1 has an associated set of routing conductors 512-01. As another example, IO circuit group pair 524-2 and 524-3 has an associated set of routing conductors 514-23. There are as many routing conductors 512 or 514 in each such set as there are clock signals on device 500 that it may be desired to use in any IO circuitry of the device. In the illustrative embodiment shown in FIG. 6, for example, there are 26 such clock signals on device 500. Thus, in this embodiment, there are 26 conductors in each set of conductors 512 and 514.

Figure 7:
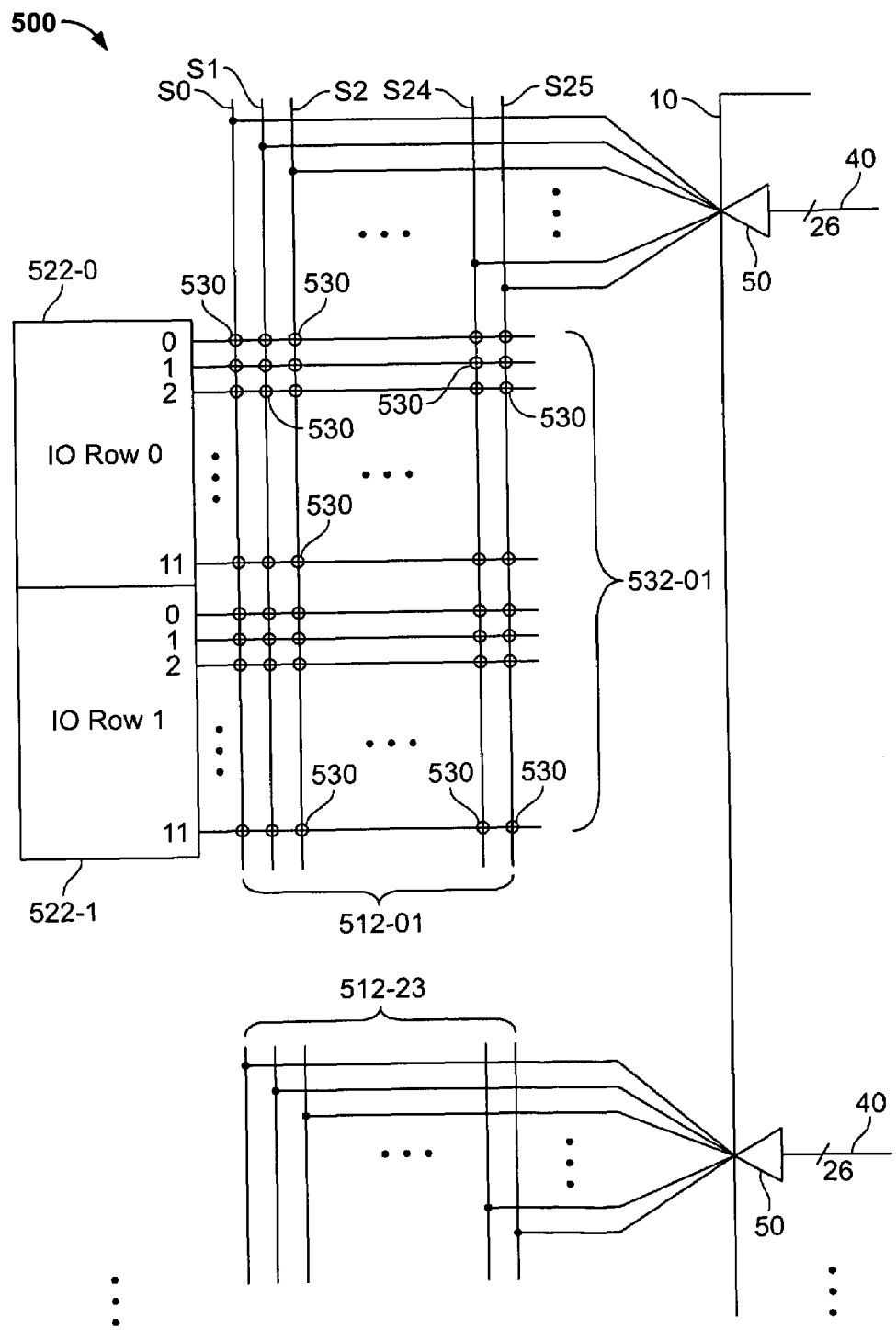
FIG. 7 is a simplified schematic block diagram of an illustrative embodiment of representative portions of the FIG. 6 circuitry, with some additional details added.

The conductors 512 or 514 in each set of such conductors span (extend past) all of the IO circuits in the associated pair of groups of IO circuits 522 or 524. Thus, for example, each of the 26 conductors 512-01 extends past all 24 of the IO circuits in groups 522-0 and 522-1. Similarly, each of the 26 conductors 514-01 extends past all 24 of the IO circuits in groups 524-0 and 524-1. FIG. 7, which will be described next, shows how conductors 512 or 514 can be used.

FIG. 7 shows a representative one of the pairs of groups of IO circuits and the associated circuitry in accordance with the invention. In particular, FIG. 7 shows IO circuit groups 522-0 and 522-1 (which are a pair), and the routing conductors 512-01 associated with that pair. Conductors 512-01 are additionally labelled S0-S25 to make it clear that there are 26 such conductors. Each of conductors 512 is connected to the output terminal of a respective one of 26 drivers 50 that are nearby in core 10. Each of these drivers 50 operates, in turn, on a respective one of the 26 clock signals on 26 clock signal conductors 40 in core 10. These 26 clock signals may come from a "spine" of clock signal conductors 40 that run vertically up and down near the center of core 10 (see the long vertical conductors 40 in FIG. 6). (Again, it is pointed out that buffer or driver symbol 50 near the upper right in FIG. 7 actually represents 26 separate instances of such buffer or driver circuitry, and that each such instance can be implemented in one or more HLEs 200 in core 10.) Thus each of conductors 512-01 can carry a respective one of 26 different clock signals from core 10.

Each of conductors 512-01 is crossed by each of 24 other routing conductors 532-01. Each of conductors 532-01 can apply a clock signal from any one of conductors 512-01 to a respective one of the IO circuits in IO circuit groups 522-0 and 522-1. This is done by mask-programmably providing a via between the conductor 512-01 that is carrying the clock signal that it is desired to apply to a particular one of the IO circuits in group 522-0 or 522-1 and the one of conductors 532-01 that leads to that IO circuit. All of the possible locations for such vias are indicated by the open circles 530 in FIG. 7. (Only a few representative ones of these open circles are actually numbered 530 to avoid over-crowding the drawing, but it will be understood that all of the open circles in FIG. 7 have the same meaning and show separate instances of the same thing, namely, the location of a possible, mask-programmably-provided via between the two conductors that intersect at that open circle.)

The lower part of FIG. 7 shows the start of another instance of the circuitry shown above. This further instance is for the next pair of IO circuit groups down (namely, IO circuit groups 522-2 and 522-3). Thus FIG. 7 shows that this next instance includes another, separate group of routing conductors 512-23, and that these routing conductors are driven by another instance of buffers 50 in core 10.

The same structure that is shown in FIG. 7 is also used across the top of core 10 (i.e., for elements 514, 524, etc.). Thus if FIG. 7 is rotated clockwise by 90°, it basically shows the topology of the peripheral IO circuitry that is used across the top of core 10. (Of course, appropriate changes in element reference numbers must be made (for example, conductors 532 might have reference number 534 in circuitry across the top of core 10). But the basic arrangement of the circuitry can be the same.)

From the foregoing, it will be apparent that the circuitry of this invention allows any of the clock signals from core 10 (illustratively any of 26 clock signals) to be applied to any of the many IO circuits 522 or 524 of structured ASIC 500. All that is required to apply a particular clock signal to a particular IO circuit is to mask-programmably provide a via 530 between the conductor 532 (or 534 as mentioned in the preceding paragraph) leading to that IO circuit and the conductor 512 (or 514) carrying that clock signal from core 10. At one extreme, all 24 IO circuits in a pair of groups 522 or 524 may receive the same clock signal from one of the associated conductors 512 or 514. At the other extreme, each of the 24 IO circuits in a pair of groups 522 or 524 may receive a respective one of 24 different clock signals from 24 different ones of the 26 associated conductors 512 or 514. Between these two extremes, the 24 IO circuits in each pair of groups 522 or 524 may share or not share clock signals from various ones of the associated conductors 512 or 514 in any desired pattern or arrangement. The circuitry is thus completely flexible as to which of the many clock signals each of the many IO circuits receives. One benefit of this flexibility is that it facilitates using structured ASIC 500 to either duplicate the pin-outs of a functionally equivalent FPGA, or to have an arrangement of pin-outs that is different to any desired extent from the pin-out arrangement of the functionally equivalent FPGA.

Recapitulating and in some respects extending certain aspects of the foregoing, the periphery clock network of structured ASIC 500 can be categorized into three specific parts. The first part includes a pre-built network (elements 40 and 50) that branches from the core clock spine (e.g., long vertical conductors 40 in FIG. 6). This network is similar to other pre-built core clock network circuitry 40/50 where it is driven by relatively thick metal routing conductors to minimize the metal delay. The pre-built network is driven by pre-built buffers 50 constructed using HLEs, which ensures optimum clock signal integrity. The pre-built network extends beyond the core 10 boundary into P&R routing region 510 between core 10 and periphery region 520.

The second portion of the clock network includes routing conductors 512 or 514 (e.g., in metal layers M3 or M4). For example, M3 metal routing may span vertically (like 512), while M4 metal routing may span horizontally (like 514) for every two IO columns or IO rows. This second network portion (512 or 514) crosses with the first, extended, pre-built network to form the first grid network structure (e.g., in the upper left in FIG. 7, where conductors from buffers 50 cross conductors 512-01). The connection between the first pre-built network and the second clock route (e.g., 512 or 514) is predefined (e.g., as shown by the solid dots at interesting conductors in FIG. 7). Thus, this first grid network may also be known as a firmed grid network. This part of the clock routing is located in P&R region 510 between core 10 and IO modules 520. Thus, the IO clock grid is pre-built without extra cost in area.

The third portion of the periphery network extends from IO register modules (in circuitry 520). The IO register clock (e.g., 532) is extended to cross with the M3/M4 metal routing 512 or 514 to form another grid structure. Each of the conductor intersections 530 in this grid structure is pre-built with an optional via (e.g., a via 3) to enable programmability (i.e., mask programmability) of the clock source into each IO register. Thus, this second clock grid structure may be known as a programmable grid network.

All three parts of the above-described clock networks are illustrated by FIGS. 6 and 7.

In a typical FPGA, each IO register clock in an IO column/row can only be accessed by the six row or nine column IO clocks (HIOCLKs or VIOCLKs) selected for that row or column from 26 system clocks (SCLKs) in the clock spine. Structured ASIC 500 greatly enhances this limited FPGA clock muxing capacity. The SCLK-HIOCLK/VIOCLK multiplexer ("mux") structure in the clock spine region of the FPGA device is removed. Instead, the VIA option 530 and the programmable clock grid infrastructure provides clock programming capability to enable the selection of the desired clock source for each of the IO registers. In other words, each of the IO registers can be driven by any clock source, which eliminates the limitations due to the muxing pattern as in the FPGA devices. FIGS. 6 and 7 show the programmable clock grid structure and the periphery clock network muxing capability of structured ASIC 500. This muxing schemes provides a super-set of the muxing capability of the FPGA devices to ensure seamless migration between an FPGA and structure ASIC 500. In addition, this is an important feature especially for supporting non-socket migration (i.e., migration from an FPGA to a structured ASIC, where the ASIC pin-out arrangement is different than the FPGA pin-out arrangement).

Figure 8:
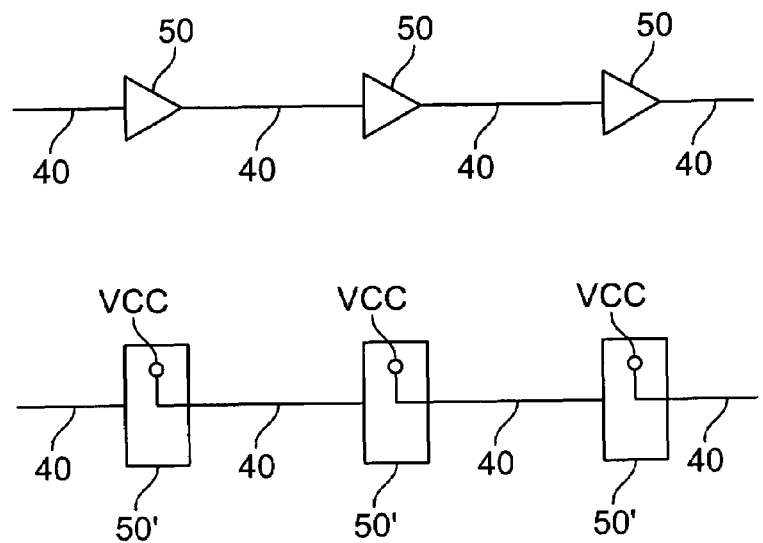
FIG. 8 is a simplified schematic block diagram showing possible alternative uses of some representative circuitry from other FIGS.

Because the periphery clock network of this invention is driven by HLE-constructed buffers, it can be powered down to the extent that portions of the clock domain are not employed in a user's design. This can be done by converting an HLE-based pre-built buffer into a tied-high macro. For example, the upper portion of FIG. 8 shows a portion of a clock signal path that is in use, and in which buffers 50 are therefore operating as buffers. The lower portion of FIG. 8 shows a portion of another clock signal path that is not in use. Accordingly, the outputs of the buffers 50' in this path are tied high (i.e., to VCC). Such tied-high macros 50' use the internal power rail (VCC) to drive the output port as shown in FIG. 8. This provides a power saving capability in which the unused periphery clock branch is converted to a power bus.

In addition, structured ASIC 500 can have speed improvement as a result of its novel architecture. The entire periphery clock network (from the core boundary out for any given clock signal going into a conductor 512 or 514 and one or more conductors 532 (or 534 if across the top of core 10)) is driven by only a single stage of pre-built buffer circuitry 50 within core region 10. This implementation can improve periphery clock TCO (time from clock to output) as compared to the FPGA from which a user's design has been migrated.

The disclosed clock grid architecture inherently reduces clock skew within the IO registers. Performance of the periphery clock network can be further enhanced with a skew control scheme. Because the periphery clock grid spans across two IO rows, the fanout load (for a clock signal on one of conductors (512) can range from a minimum of one fanout to a maximum of 24 fanouts. A controllable and balanced clock delay between the periphery clock routes having different fanout loads may be desirable, e.g., to help support high-speed IO interface applications. This can be achieved using mask-programmable pre-built buffers 50 that drive the periphery clock branches located within core region 10. (See the next paragraph for examples of how buffers 50 can be mask-programmed to provide different drive strengths.) Based on the fanout load, these pre-built buffers 50 can provide equitable drive strength, while balancing the periphery clock delay between minimum and maximum fanout load. A look-up table of buffer drive strengths versus fanout load can be predetermined to ensure faster turn-around time during the backend FPGA to structured ASIC design conversion stage and timing closure.

Figure 9A:
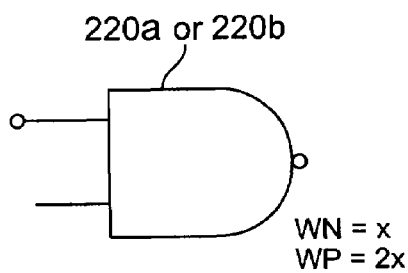
FIGS. 9a-c and 10a-c are simplified schematic block diagrams showing various examples of how certain circuit components from other FIGS. may be used.
Figure 9B:
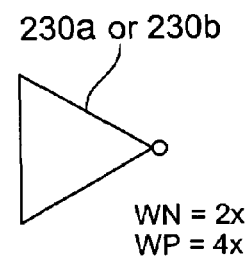
Figure 9C:
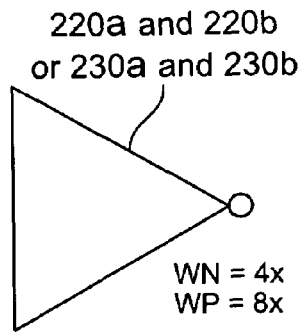
Figure 10A:
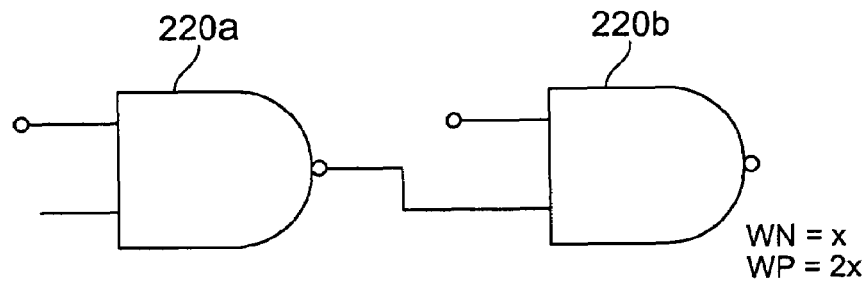
Figure 10B:
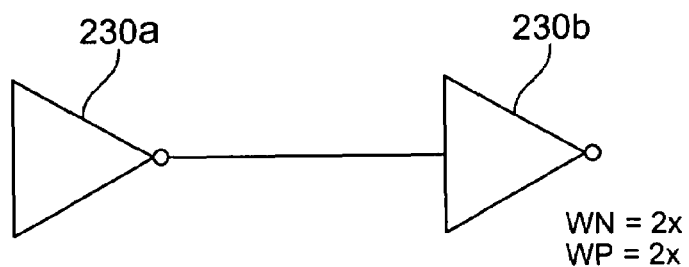
Figure 10C:
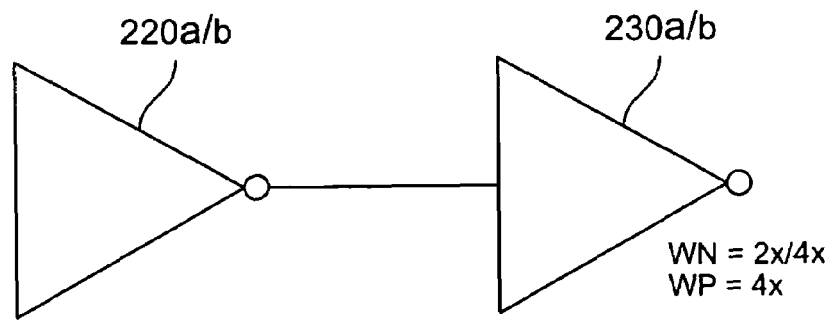

FIGS. 9*a-c* and 10*a-c* show examples of ways that the circuitry of an HLE 200 can be used to provide a buffer (driver) 50 of mask-programmably selectable strength. These FIGS. are reproductions of FIGS. 21*a-c* and 22*a-c* in Chua et al. U.S. Pat. No. 7,243,329. FIGS. 9*a-c*, for example, show various ways that an inverter can be provided. In FIG. 9*a*, one of NAND gates 220 is used with one of its inputs tied to logic 1 (VCC). In FIG. 9*b*, one of inverters 230 is used. In FIG. 9*c*, both of NAND gates 220*a* and 220*b* or both of inverters 230*a* and 230*b* are connected in parallel (by appropriately mask programming interconnection resources in the HLE) to effectively provide one larger inverter, e.g., for stronger output driving from the HLE. Each of the structures shown in FIGS. 9*a-c* can be used to provide a buffer (driver) 50, with the FIG. 9*a* structure having the weakest drive strength, the FIG. 9*b* structure having intermediate drive strength, and the FIG. 9*c* structure having the greatest drive strength. FIGS. 10*a-c* show several examples of how non-inverting buffers can be provided. In FIG. 10*a*, NAND gates 220*a* and 220*b* are connected in series, with an input terminal of each NAND gate tied to logic 1. Again, the routing resources of the HLE 200 are mask programmed to connect the NAND gates in series. In FIG. 10*b*, inverters 230*a* and 230*b* are similarly connected in series. In FIG. 10*c*, NAND gates 220*a* and *b* are connected in parallel in inverter configuration (e.g., as in FIG. 9*a*) to effectively provide one larger first inverter 220*a/b*, and inverters 230*a* and *b* are similarly connected in parallel to effectively provide one larger second inverter 230*a/b*. As in FIG. 9*c*, the effectively larger elements in FIG. 10*c* provide stronger output drive from the HLE. Again, the drive strength of the FIG. 10 structures increases from FIG. 10*a* to FIG. 10*b* to FIG. 10*c*.

It will be understood that the foregoing is only illustrative of the principles of this invention, and that various modifications can be made by those skilled in the art without departing from the scope and spirit of the invention. For example, the numbers of elements in various groups of elements shown herein are only examples of element group sizes that can be used. Larger or smaller groups can be used if desired (as long as any "group" includes a plurality of elements).

In the above discussion, the plural IO circuits in each box 522 or 524 are referred to as a group of such elements, and two adjacent such groups are referred to as a pair of groups. This terminology can be consistent with the use of the word group in the appended claims. Alternatively, the word group in the appended claims can refer to what is described as a pair of groups in the above specification. Of course, these are only some examples of how the appended claims may be interpreted and applied. Some of the appended claims refer to conductors 512 or 514 being discontinuous or electrically isolated from one group to the next. This refers to the fact (for example) that conductors 512-01 are not connected to conductors 512-23 etc., or (as another example) that conductor 514-01 are not connected to conductors 514-23, etc. Applicants wish to emphasize here again that each depiction of a component 50 typically represents many parallel and separate instances of such circuitry. Similarly, each depiction of a conductor 40 typically represents many parallel and separate instances of such a component. Applicants also wish to emphasize here again that each instance of a component 50 is preferably implemented in a suitably mask-programmed HLE 200 in the sea of HLEs 200 in core circuitry 10. Mask-programmably provided vias are typically used to get a signal from a conductor segment 40 in a higher metal layer down into the HLE 200 acting as a component 50, and then back up out of that HLE 200 to another conductor segment 40 in a higher metal layer.

The invention claimed is:
1. An integrated circuit device comprising:
   core circuitry having an outer periphery;
   a plurality of IO circuits disposed outside of said outer periphery, said IO circuits being grouped in a multiplicity of groups, each of which groups includes a respective subplurality of adjacent ones of said IO circuits; and
   clock signal routing circuitry disposed between said outer periphery and each of said groups, said routing circuitry including, in association with each of said groups, (1) a plurality of first conductors, each of which extends past all of the IO circuits in the associated group, and each of which receives a respective one of a plurality of clock signals from the core circuitry, (2) a plurality of second conductors, each of which extends across all of the first conductors to a respective one of the IO circuits in the associated group, and (3) a mask-programmable via option at each intersection between a first conductor and a second conductor.

2. The device defined in claim 1 wherein the first conductors associated with each of the groups are discontinuous with the first conductors associated with each of the other groups.

3. The device defined in claim 1 wherein the plurality of first conductors associated with each of the groups is greater in number than the plurality of second conductors associated with that group.

4. The device defined in claim 1 wherein the core circuitry comprises driver circuitry for driving each of the clock signals onto each of the first conductors that receives that clock signal.

5. The device defined in claim 4 wherein the driver circuitry comprises:
separate driver circuitry for the first conductors associated with each of the groups.

6. The device defined in claim 5 wherein the separate driver circuitry associated with each of the groups comprises:
a separate driver circuit for each of the first conductors associated with that group.

7. The device defined in claim 1 wherein the first conductors associated with each group receive all of the same clock signals that are received by the first conductors associated with each other group.

8. The device defined in claim 1 wherein the device comprises a structured ASIC.

9. An integrated circuit device comprising:
core circuitry having an outer periphery;
a plurality of IO circuits disposed outside of said outer periphery, said IO circuits being grouped in a plurality of groups, each of which includes a respective subplurality of adjacent ones of said IO circuits; and
clock signal routing circuitry associated with each of said groups and disposed between the associated group and the outer periphery, the routing circuitry associated with each of said groups comprising:
a plurality of first conductors that each extend past all of the IO circuits in the associated group and that each carry a respective one of a plurality of clock signals received from the core circuitry;
a plurality of second conductors that each extend to a respective one of the IO circuits in the associated group and also across all of the first conductors associated with that group; and
a mask-programmable via option at each intersection between a first conductor and a second conductor.

10. The device defined in claim 9 wherein the core circuitry comprises:
driver circuitry associated with each of the groups for driving the plurality of clock signals from the core circuitry to the first conductors associated with that group.

11. The device defined in claim 10 wherein the driver circuitry associated with each of the groups comprises:
a plurality of separate driver circuits, each of which drives a respective one of the clock signals to a respective one of the first conductors associated with that group.

12. The device defined in claim 10 wherein the driver circuitries associated with all of the groups drive the same plurality of clock signals to the first conductors associated with all of the groups.

13. The device defined in claim 10 wherein the driver circuitry associated with each of the groups is at the outer periphery adjacent the associated group.

14. The device defined in claim 9 wherein the first conductors associated with each of the groups are electrically isolated from the first conductors associated with all others of the groups.

15. The device defined in claim 9 wherein the device comprises a structured ASIC.

16. An integrated circuit device comprising:
core circuitry including clock signal distribution circuitry;
a plurality of IO circuits outside of the core circuitry and grouped in a plurality of groups, each of which includes a subplurality of adjacent ones of the IO circuits; and
clock signal routing circuitry associated with each of the groups between the core circuitry and the associated group, the routing circuitry associated with each group comprising:
a plurality of first conductors that each carries a respective one of a plurality of clock signals received from the clock signal distribution circuitry and that each extends past all of the IO circuits in the associated group;
a plurality of second conductors that each connects to a respective one of the IO circuits in the associated group and that each extends across all of the first conductors associated with that group; and
a mask-programmable via option at each intersection of a first conductor and a second conductor.

17. The device defined in claim 16 wherein the clock distribution circuitry comprises:
driver circuitry adjacent each of the groups for driving the plurality of clock signals from the clock distribution circuitry to the first conductors associated with the adjacent group.

18. The device defined in claim 16 wherein the device comprises a structured ASIC.

19. An integrated circuit device comprising:
core circuitry;
IO circuits;
first and second intersecting conductors disposed in a portion of the device, said first conductors overlapping and connected to circuitry extending from the core circuitry into said portion, said second conductors overlapping and connected to circuitry extending from the IO circuits into said portion; and
a mask-programmable connection at each intersection between the first and second conductors, whereby a signal from the core circuitry can be programmably routed to any one or more of the IO circuits.

20. The device defined in claim 19 wherein the device comprises a structured ASIC.

* * * * *